United States Patent
Kashima et al.

(10) Patent No.: US 8,147,984 B2
(45) Date of Patent: Apr. 3, 2012

(54) CLAD TEXTURED METAL SUBSTRATE FOR FORMING EPITAXIAL THIN FILM THEREON AND METHOD FOR MANUFACTURING THE SAME

(75) Inventors: Naoji Kashima, Aichi (JP); Shigeo Nagaya, Aichi (JP); Kunihiro Shima, Gunma (JP); Hirofumi Hoshino, Gunma (JP)

(73) Assignees: Chubu Electric Power Co., Inc., Aichi (JP); Tanaka Kikinzoku Kogyo K.K., Tokyo (JP)

( * ) Notice: Subject to any disclaimer, the term of this patent is extended or adjusted under 35 U.S.C. 154(b) by 945 days.

(21) Appl. No.: 12/101,228

(22) Filed: Apr. 11, 2008

(65) Prior Publication Data
US 2008/0261059 A1 Oct. 23, 2008

(30) Foreign Application Priority Data

Apr. 17, 2007 (JP) .............................. P2007-108605

(51) Int. Cl.
- B32B 15/04 (2006.01)
- B32B 15/18 (2006.01)
- B32B 37/00 (2006.01)
- C22F 1/10 (2006.01)
- C09J 5/02 (2006.01)

(52) U.S. Cl. ............ 428/679; 428/680; 216/66; 216/67; 156/272.2; 156/306.3; 148/527; 148/530

(58) Field of Classification Search .................. None
See application file for complete search history.

(56) References Cited

U.S. PATENT DOCUMENTS

| 6,428,635 | B1 | 8/2002 | Fritzemeier et al. .......... 148/435 |
| 2004/0023810 | A1 | 2/2004 | Ignatiev et al. ............... 505/100 |

OTHER PUBLICATIONS

Varanasi, Chakrapani V., et al. "Biaxially Textured Copper and Copper-Iron Alloy Substrates for use in YBa2Cu307-x Coated Conductors." Superconductor Science and Technology, 2006, vol. 19, p. 85-95.*

Miyoshi et al, "Development of Textured Substrates With High Strength and Weak Magnetism." Physica C, vol. 445-448, Oct. 1, 2006, pp. 614-619.

Watanabe, et al, "Surface-Oxidation Epitaxy of Ni-Clad Ni-20wt%Cr and Ni-Clad Austenitic Stainless Steel Tapes for Y-Ba-Cu-O Coated Conductors." IEEE Transactions on Applied Superconductivity, vol. 11, No. 1, Mar. 2001, pp. 3134-3137.

Watanabe, et al, "Long Length Oxide Template for YBCO Coated Conductor Prepared by Surface-*Oxidation Epitaxy Method*." Physica C, vol. 357-360, Aug. 1, 2001, pp. 914-922.

Shi, et al, "YBCO Coated Conductor Using Biaxially Textured Clad Composite Ni-Mn/Ni-Cr Substrate." Superconductor Science and Technology, vol. 18, No. 10, Oct. 1, 2005, pp. 1405-1409.

* cited by examiner

*Primary Examiner* — Aaron Austin
(74) *Attorney, Agent, or Firm* — Roberts & Roberts, LLP

(57) ABSTRACT

The present invention provides an oriented substrate for forming an epitaxial thin film thereon, which has a more excellent orientation than that of a conventional one and a high strength, and a method for manufacturing the same. A clad textured metal substrate for forming the epitaxial thin film thereon according to the present invention comprises a metallic layer and a nickel layer which is bonded to at least one face of the metallic layer, wherein the nickel layer has a {100}<001> cube texture in which a deviating angle $\Delta\phi$ of crystal axes satisfies $\Delta\phi \leq 7$ degrees and has a nickel purity of 99.9% or more. The oriented metal substrate is manufactured by cold-working the nickel sheet having a purity of 99.9% or more, heat-treating it for orientation, and bonding the metal sheet with the oriented nickel sheet by using a surface activated bonding process.

16 Claims, 4 Drawing Sheets

US 8,147,984 B2

CLAD TEXTURED METAL SUBSTRATE FOR FORMING EPITAXIAL THIN FILM THEREON AND METHOD FOR MANUFACTURING THE SAME

CROSS REFERENCE TO RELATED APPLICATIONS

This application claims the benefit of Japanese patent application number 2007-108605 filed on Apr. 17, 2007.

BACKGROUND OF THE INVENTION

1. Field of the Invention

The present invention relates to a textured metal substrate for forming an epitaxial thin film thereon and a method for manufacturing the same, and specifically relates to an oriented substrate which is provided with a nickel layer having a predetermined orientational structure, can make the thin film of high quality epitaxially grown thereon, and has a reliable strength, and a method for manufacturing the same.

2. Description of the Related Art

In recent years, a thin film produced while paying attention to characteristics of an epitaxial crystal structure is used in various fields. For instance, a superconducting thin film (an epitaxial thin film formed of oxide superconducting material) having the epitaxial crystal structure is used in a superconducting conductor, a superconducting shield and the like, which are applied to various electric power units. However, the superconducting thin film having such an epitaxial crystal structure is inferior in workability, and has a defect of being hardly molded into a desired shape. For this reason, a superconductor of a shape suitable for a field of application is conventionally obtained by appropriately employing a substrate for applying a superconducting material thereon, and epitaxially growing the superconducting film on the surface. As such a substrate for forming a superconducting film thereon, a textured metal substrate is used which has a $\{100\}<001>$ cube texture employs and is made from nickel or a nickel alloy (for instance, National Publication of International Patent Application No. 2001-518564 and National Publication of International Patent Application No. 2006-513553). Characteristics of a superconducting material are affected by the orientation of composing crystals, and the crystal structure formed through epitaxial growth is affected by the orientation of the surface of the substrate. A substrate having excellent orientation can be easily obtained by appropriately adding working and heat treatment (recrystallization) to a nickel-based metallic material.

However, a clad textured metal substrate for forming an epitaxial thin film made from the above described nickel-based material has several problems. Particularly, a problem of the strength is pointed out. This is because the crystal structure of the textured metal substrate is formed basically by recrystallization, and a metal having a recrystallized structure cannot help decreasing the strength, which is general characteristics of a metallic material. Then, it is hard to handle the substrate having poor strength when forming a superconducting film thereon and using the electric conductor, because the substrate may be damaged.

In addition, a conventional nickel-based substrate has not had a satisfactory orientational structure even though having it. The orientation of a substrate greatly affects the characteristics of the epitaxial thin film formed thereon, so that the substrate is required to have an orientation as adequate as possible.

The present invention has been accomplished based on the above described background, and is directed at providing the oriented substrate for forming an epitaxial thin film thereon which has a better orientation than that of a conventional one and a high strength, and a method for manufacturing the same.

SUMMARY OF THE INVENTION

The present inventors made an extensive investigation for solving the above described problems, and determined that the solving method is to employ a clad substrate having a two-layer structure to improve the strength, which comprises a nickel layer of a substrate for growing an epitaxial thin film thereon and a metallic layer for supporting the nickel layer. Furthermore, the present inventors found that the orientation of the nickel layer can be improved by highly purifying the nickel layer, and conceived the present invention.

Specifically, the present invention provides a clad textured metal substrate for forming an epitaxial thin film thereon, which includes a metallic layer and a nickel layer bonded to at least one face of the metallic layer, wherein the nickel layer has a $\{100\}<001>$ cube texture having a deviating angle $\Delta\phi$ of crystal axes satisfying $\Delta\phi \leqq 7$ degrees and the nickel layer contains nickel having a purity of 99.9% or higher.

A crystal structure of the nickel layer according to the present invention is the $\{100\}<001>$ cube texture, and the deviating angle $\Delta\phi$ of crystal axes, which is an index of the orientation (orientation degree), is $\Delta\phi \leqq 7$ degrees. In the present invention, metallic crystals composing the nickel layer are biaxially oriented. Specifically, the face $\{100\}$ is approximately parallel to the surface of the substrate, an axis $<001>$ is oriented approximately parallel to a longitudinal direction of the substrate surface, and the deviating angle is 7 degrees or less. This is because the deviating angle $\Delta\phi$ needs to be controlled to 7 degrees or less, in order to form an epitaxial thin film having higher quality. The $\Delta\phi$ is preferably as small as possible and is ideally 0 degree, that is to say, crystals have no deviation of crystal axes among them. However, when considering production possibility, the $\Delta\phi$ is preferably 0.1 degrees or more.

The present inventors found that it is necessary to make the purity of the nickel layer high, and specifically 99.9% or higher (3N or higher), in order to impart the above described high orientation to the nickel layer. This is because impurities in the nickel layer prevent crystals from being oriented when recrystallized. In this regard, a metal substrate made from (pure) nickel of a conventional grade contains nickel having a purity of 99.9% or less (because dominating commercially-available nickel has a purity of approximately 99% (2N)), and the impurities of even less than 1% prevent the crystals from being oriented when being recrystallized. The metal substrate according to the present invention improves the orientation of the nickel layer by controlling the nickel purity to 99.9% (3N) or higher and more preferably 99.99% (4N) or higher.

An orientation substrate for forming an epitaxial thin film according to the present invention has an approximately flat bonded interface of a nickel layer with a metallic layer, and the waviness is preferably in a range of 1 to 500 nm. When the unevenness of the bonded interface is large, the nickel layer shall have ununiform thickness. Particularly when the nickel layer is thin, even the slight unevenness makes the thickness of the nickel layer ununiform, and consequently gives a harmful influence on an epitaxial thin film to be grown on the nickel layer. Accordingly, the bonded interface between the metallic layer and the nickel layer is preferably in a state of being sufficiently flattened and being free from such an oxide coating and an adsorbate as to obstruct the flattening of the interface. In the present invention, the waviness means the unevenness which is observed in a cross section of the bonded interface, and the dimension of the waviness means an amplitude between the top end and the bottom end of adjacent waves. A metal substrate according to the present invention has a mean value of waviness preferably in a range of 1 to 500 nm when measured through observation (SEM or TEM) for the cross section.

The nickel layer also has a surface roughness Ra preferably of 10 nm or less on its surface. This is because the surface roughness of the surface of the nickel layer can affect characteristics of an epitaxial thin film which will grow on the surface. The lower limit of the surface roughness is preferably as small as possible, but is preferably 0.1 nm or more when considering a working limit and efficiency.

A metallic layer which supports the above described nickel layer and composes a substrate is preferably made from any of stainless steel and a nickel alloy (hastelloy alloy, inconel alloy, incoloy alloy, monel alloy and the like). The above described materials are preferred in order to secure the strength of the nickel layer from the viewpoint that the metallic layer needs to have adequate strength and flexibility even having a thin sheet shape or a tape shape.

The thickness of the oriented substrate (total thickness of nickel layer and metallic layer) according to the present invention is not particularly limited, but can be set according to the thickness of an epitaxial thin film to be produced, and can cope with various shapes such as a sheet shape, a thin sheet shape and a tape shape (1 mm or less). In addition, the thickness of the nickel layer and the metallic layer are not limited in particular, but the thickness of the metallic layer is preferably 40% or more of that of the whole oriented substrate in order to secure the strength. The metallic layer preferably has a thickness of 10 μm or more.

When manufacturing an oriented substrate for forming an epitaxial thin film according to the present invention, it is necessary to make an orientation of a nickel layer sufficient and make the nickel layer strongly bonded with a metallic layer. As a manufacturing method for satisfying such a request, a cladding method is considered which involves pressure-welding a crystal-oriented nickel sheet (nickel sheet) with a metal sheet which will be a metallic layer, but the method cannot achieve the original object of manufacturing an oriented substrate, because of disordering the crystal orientation of the nickel layer by a pressure in pressure welding. On the other hand, a method of firstly cladding the nickel sheet with the metal sheet and then heat-treating the clad to make the crystals of the nickel layer oriented is considered as well, but the method cannot achieve the object of high strength, because the metal sheet is softened by heat treatment in the orienting treatment and loses the function as a reinforcing member.

The present inventors found that a method of subjecting a nickel sheet which will be a nickel layer to orienting treatment at first and bonding a metal sheet which will be a metallic layer with the oriented nickel sheet without or through the application of low pressure by using a surface activated bonding process is suitable for a method of manufacturing an oriented substrate according to the present invention. The method can strongly bond the metal sheet with the nickel layer while keeping the orientation of the nickel layer. The manufacturing method includes the following steps:

(a) an orienting heat treatment step of cold-working a nickel sheet having a purity 99.9% or higher at a working rate of 95% or more, and heat-treating the nickel sheet obtained through the cold working in a non-oxidative atmosphere to make at least the surface part a {100}<001> cube texture having a deviating angle Δφ of crystal axes satisfying Δφ≦7 degrees;

(b) a step of preparing a metal sheet; and (c) a surface activated bonding step of dry-etching the surfaces to be bonded of the nickel sheet obtained by the orienting heat treatment step and the metal sheet in a non-oxidation atmosphere to remove the oxide and adsorbate on the surfaces to be bonded, and bonding the nickel sheet with the metal sheet without or through the application of pressure.

The method according to the present invention includes the step of firstly cold-working and heat-treating the nickel sheet for orientation, as in the above described step (a). The nickel sheet used in the step needs to have a purity of 99.9% (3N) or higher. As described above, this is because when the nickel purity is low, a structure in which the crystals are sufficiently oriented cannot be obtained. In addition, the nickel sheet is worked at a working rate of 95% or higher and is preferably 98% or higher. When the working rate is lower than 95%, a sufficiently oriented structure cannot be obtained.

It is preferable to set a treatment temperature of orienting heat treatment (recrystallization treatment) after cold working to 250° C. or higher but a melting point of nickel or lower. When the heat treatment temperature is lower than 250° C., the nickel layer may not obtain adequate orientational structure. The heat treatment temperature is preferably in a range of 300 to 700° C. A heat treatment period of time is preferably in a range of 1 to 10 minutes. When the heat treatment temperature is higher than 700° C. or the heat treatment period of time is longer than 10 minutes, the groove in a crystal grain boundary may be deepened and a polishing operation may be necessary after orienting treatment in order to remove the groove.

Furthermore, according to the present inventors, the nickel sheet to be an object for orienting heat treatment has a preferable thickness range in order to effectively direct the crystals, and preferably has a thickness of a certain value or more. The reason is not clear. However, when the nickel sheet is too thin, the obtained structure occasionally is insufficiently oriented. The nickel sheet has a thickness of 20 μm or more, and preferably has 30 to 200 μm. Accordingly, the nickel sheet after cold working before heat treatment preferably has the above described thickness or more.

However, the above thickness condition is a request for a nickel sheet when the nickel sheet is subjected to the orienting treatment, and does not specify the thickness of the nickel layer after having been cladded with a metal sheet. For instance, a clad textured metal substrate with a thin nickel layer can be obtained by subjecting the nickel sheet with a thickness of 20 μm or more to the orienting treatment, and working the nickel layer into the thickness of less than 20 μm before or after the cladding step by using a cutting method, a polishing method or the like.

After the nickel sheet has been subjected to orienting heat treatment in this way, a metal sheet to be bonded with the nickel sheet is prepared. A commercial sheet or a tape material may be directly used as the metal sheet or may be subjected to pretreatment for working such as rolling before being used as the metal sheet.

In the present invention, a surface activated bonding process is employed as a method of bonding an oriented nickel layer with a metallic layer (the above described step (c)). The surface activated bonding process is a method of, as described above, removing an oxide and adsorbate on the faces (surfaces) to be bonded by dry etching, and bonding the faces immediately after having exposed a base material (pure metal) to the atmosphere. The bonding method is based on metal atomic force, which is generated between atoms (molecules) in a state of having removed all impurities such as oxides from the surfaces.

Either of etching methods using an ion beam or atom beam of Ar or the like, or using plasma can be specifically used as a method of dry etching for activating the surfaces. It is necessary to carry out the dry etching process in a non-oxidation atmosphere, and it is preferable to carry out the dry etching process particularly in a vacuum.

The surface activated bonding process can bond the materials to be bonded without the application of pressure, and can bond them as well only by overlapping them. However, it is acceptable to pressurize both materials, in order to align them or bond them more strongly. However, the pressurizing force is as low as not to deform the shape of the materials, and is preferably in a range of 0.01 to 300 MPa. The surface activated bonding process can bond the material at room temperature. Accordingly, it is not necessary to heat the working atmosphere in a bonding operation. When the materials are being dry-etched, the temperature on the surface of the materials may rise, but the temperature rise is different from heating for the bonding operation. It is preferable to make the atmosphere non-oxidative when the materials are bonded, as well.

Thus, the clad textured metal substrate formed of a nickel layer having an orientational structure and a metallic layer can be manufactured by the above described steps. In the present invention, a surface roughness Ra of the surface (surface on which epitaxial film will be grown) of a nickel layer is preferably 10 nm or less, so that it is preferable to appropriately treat the surface of the nickel layer. The surface roughness of the nickel layer is preferably adjusted by polishing the surface with any method of an electrolytic polishing method, a mechanical polishing method, a chemical polishing method including a chemical polishing method, a chemomechanical polishing method and the like, and an electro-composite polishing method including an electro-abrasive polishing method, an electromechanical polishing method and the like. At least the surface of the nickel sheet after having been subjected to orienting treatment is preferably polished. Alternatively, it is acceptable to polish the nickel sheet before and after finish rolling prior to the orienting treatment, and polish the nickel sheet again after the orienting treatment or a cladding operation.

The clad substrate according to the present invention preferably has a small waviness of the interface between the nickel layer and the metallic layer. The waviness can be controlled by flattening a reduction roll to be used when the nickel sheet and the metal sheet are rolled. A surface activated bonding process can bond the sheets without the application of pressure or through the application of low pressure, accordingly can keep surfaces to be bonded flat by previously flattening the surfaces before bonding them. In this regard, the sheets are preferably finish-rolled in a rolling process, by using a lapping roll made from cemented carbide which is hard to produce waviness. Alternatively, the sheets may be polished by using the above described polishing method.

As discussed above, a substrate for forming an epitaxial thin film thereon according to the present invention has a metallic layer cladded on a nickel layer having an orientational structure, and accordingly has a higher strength than a conventional substrate. A manufacturing method according to the present invention can stably form a thin film of high quality without damaging the substrate, in a process of forming the epitaxial thin film such as a superconducting film onto the substrate.

DETAILED DESCRIPTION OF THE PREFERRED EMBODIMENTS

Preferred embodiments according to the present invention will now be described below with reference to the drawings.

First Embodiment

A tape-shaped nickel sheet (with the purity of 99.99%) with a thickness of 3,000 μm was prepared and was cold-rolled (at room temperature) into a thickness of 30 μm with a reduction roll at a working rate set at 99%. At this time, the nickel sheet was electrolytically polished and then finish-rolled by using a lapping roll made from cemented carbide. The nickel sheet was electrolytically polished in a sulfuric-acid-based electrolytic solution at a current density of 35 A/dm$^2$ for 30 seconds. After rolled, the nickel sheet was heat-treated and the crystal structure was oriented. In the heat treatment step, the nickel sheet was heated in an atmosphere containing 95% of nitrogen gas and 5% of hydrogen gas at 250° C. for 10 minutes.

Next, a metal sheet to be cladded with the above described nickel sheet was prepared. The prepared metal sheet was a stainless steel sheet (SUS304) which had been rolled into a tape shape with a thickness of 100 μm beforehand.

Figure 1:
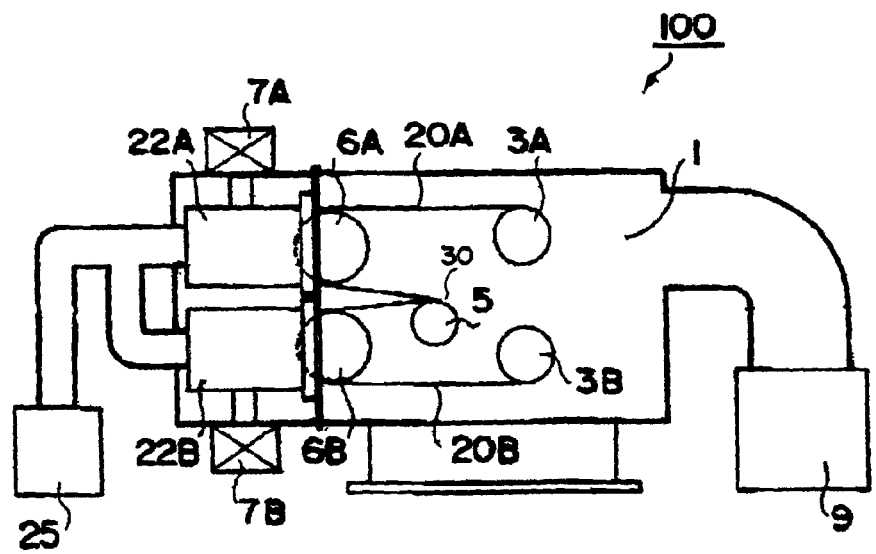
FIG. 1 is a schematic view of a surface activated bonding apparatus in the present embodiment.
Figure 2:
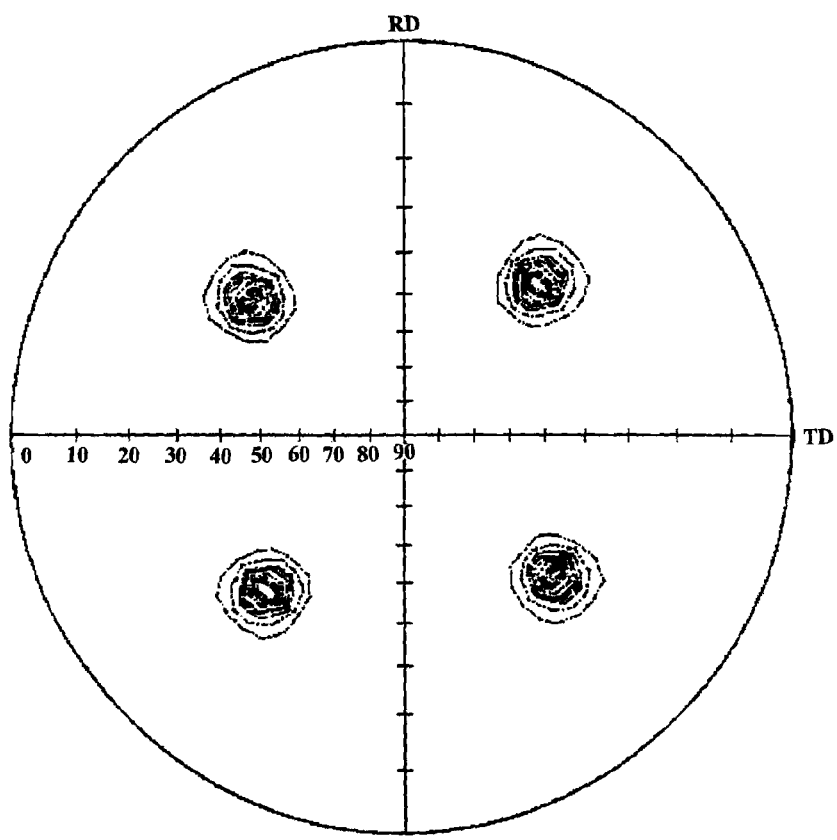
FIG. 2 is an X-ray pole figure of a nickel layer surface of a clad textured metal substrate according to a first embodiment.
Figure 3:
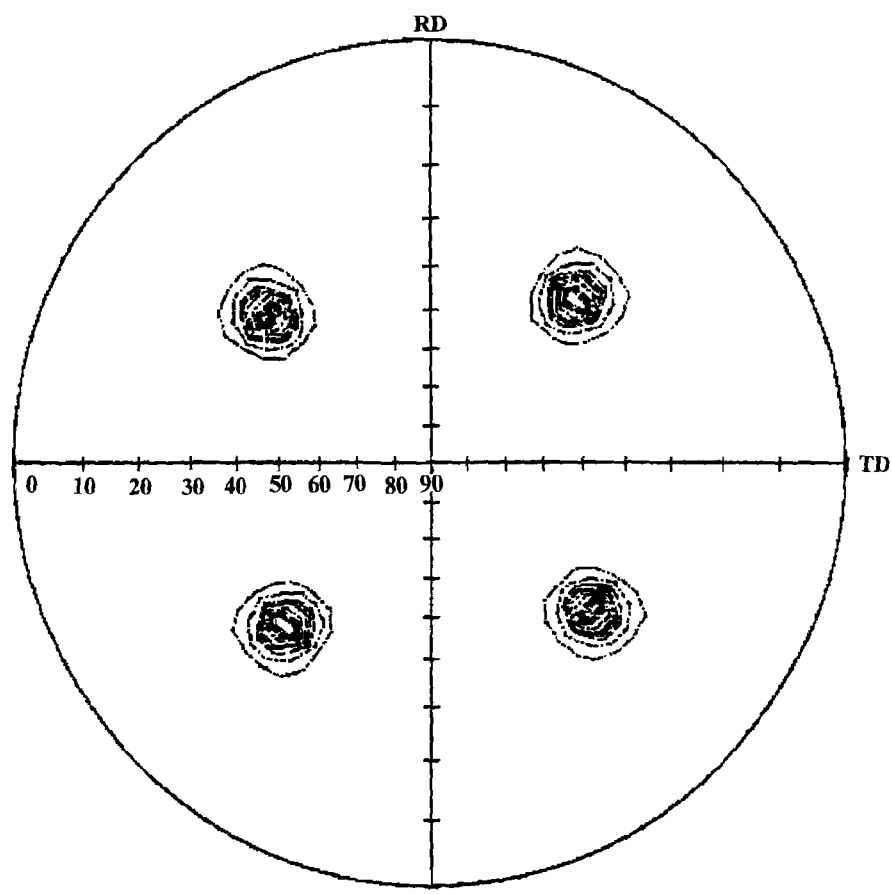
FIG. 3 is an X-ray pole figure of a nickel layer surface of a clad textured metal substrate according to a second embodiment.
Figure 4:
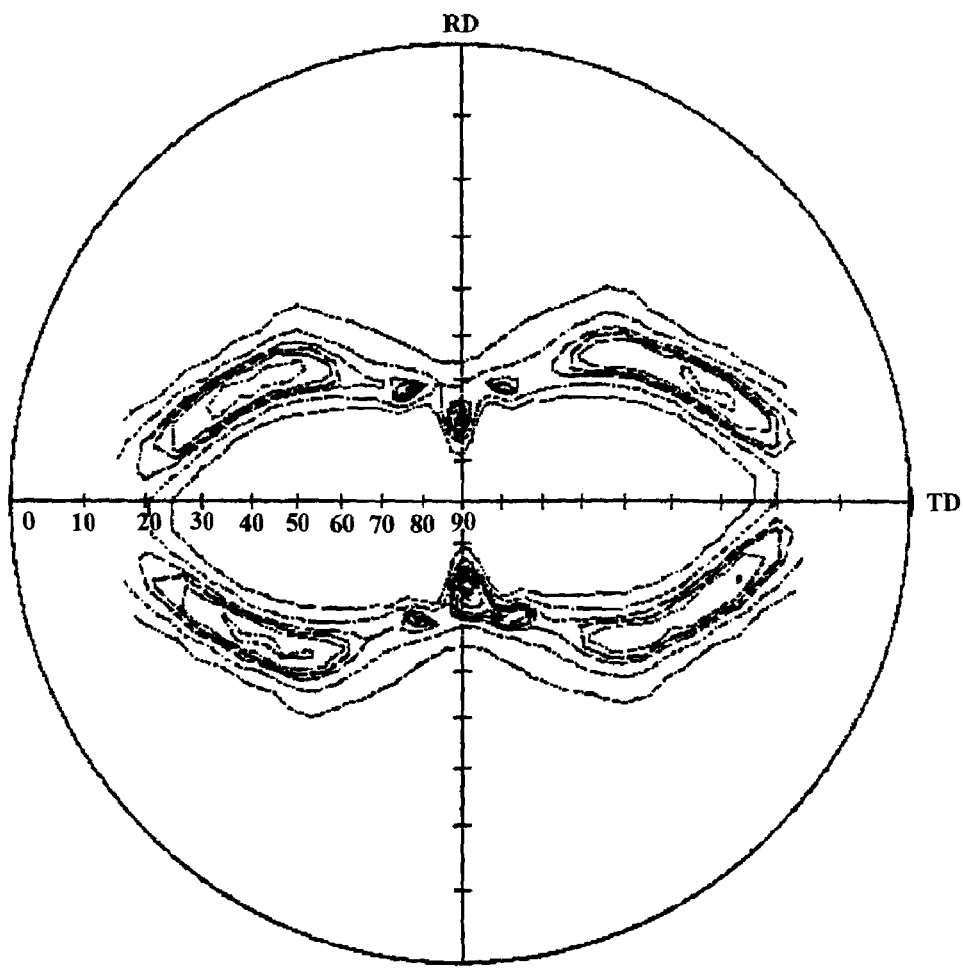
FIG. 4 is an X-ray pole figure of a nickel layer surface of a clad textured metal substrate according to Comparative example 1.
Figure 5:
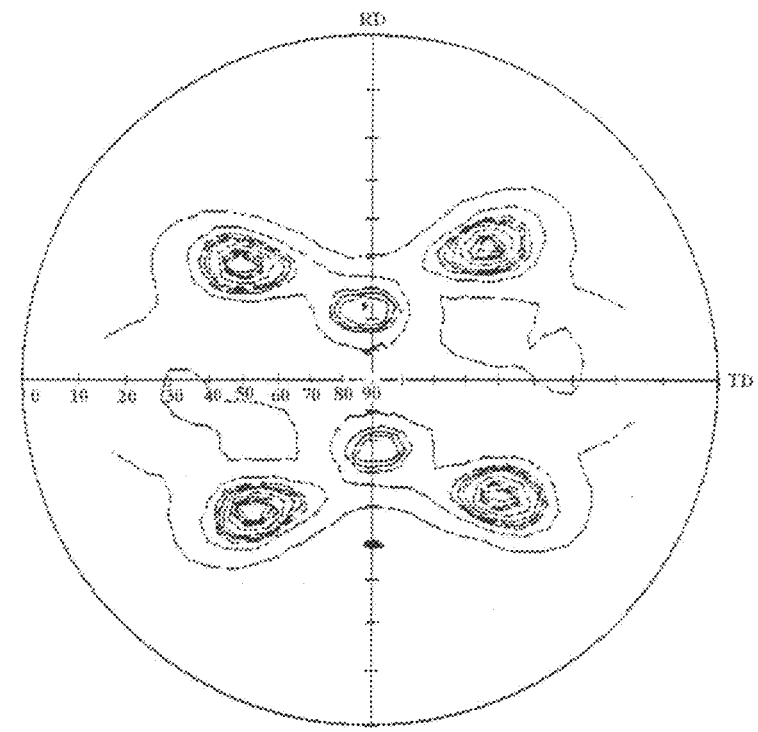
FIG. 5 is an X-ray pole figure of a nickel layer surface of a clad textured metal substrate according to Comparative example 2.

The nickel sheet and the metal sheet were bonded by using the surface activated bonding process to form a clad sheet. FIG. 1 illustrates a surface activated bonding apparatus 100 used in the present embodiment. The surface activation apparatus 100 is a vacuum apparatus, and is partitioned into etching chambers 22A, 22B and a vacuum tank 1 so as to be vacuum-sealed from each other. The etching chambers 22A and 22B function so as to dry-etch a nickel sheet 20A and a metal sheet 20B respectively. The vacuum tank 1 and the etching chambers 22A and 22B are also connected to exhaust pump units 9 and 25 respectively.

Electrode rolls 6A and 6B are installed for passing an electric current while holding the nickel sheet 20A and the metal sheet 20B. Each one part of the electrode rolls is arranged so as to project into the etching chambers 22A and 22B. Electrodes (not shown) for passing an electric current to the electrode rolls 6A and 6B are provided at predetermined parts on outer walls of the etching chambers 22A and 22B respectively. Power supply units 7A and 7B are installed so as to apply high voltage between respective electrodes.

In the vacuum chamber 1, wind-off reels 3A and 3B are installed so as to wind off a nickel sheet 20A and a metal sheet 20B which are to be dry-etched. In addition, a wind-up roll 5 is installed so as to wind up the nickel sheet 20A and the metal sheet 20B which were dry-etched and bonded with each other.

The surface activated bonding apparatus 100 makes the wind-off reels 3A and 3B wind-off the nickel sheet 20A and the metal sheet 20B, hang the sheets on the peripheral surfaces of electrode rolls 6A and 6B respectively, applies high voltage to the sheets in etching chambers 22A and 22B, thereby makes an inert gas such as argon gas sealed in the room generate glow discharge, and makes the molecules of the inert gas sputter the surfaces of the nickel sheet 20A and the metal sheet 20 due to high voltage to etch the surfaces. Thus, the bonding apparatus removes an oxide and adsorbate on the surfaces to make the surfaces clean and flat. Then, the activated nickel sheet 20A and metal sheet 20B are bonded along with the operation of the wind-up roll 5, and a clad textured metal substrate 30 is manufactured. In the present embodiment, conditions of dry etching were set as described below.

Etching method: Ar beam etching
Vacuum degree: $10^{-5}$ Pa (under argon gas atmosphere in vacuum tank and etching chamber)
Applied voltage: 2 kV
Etching period of time: 5 minutes
Pressurizing force in cladding operation: 2 MPa Thus manufactured clad textured metal substrate was collected, and the surface of the nickel layer was electrolytically polished in a similar condition to the above described one. Then, the state of orientation of the nickel layer and the bonded interface were confirmed.

Second Embodiment a clad textured metal substrate was manufactured by heat-treating the same nickel sheet as in First Embodiment at a changed temperature of 200° C. so as to orient the structure of the surface, and on the same conditions as in First Embodiment except the heat treatment temperature.

Comparative Example 1 a clad textured metal substrate was manufactured by heat-treating the nickel sheet at a temperature of 200° C. in order to investigate the influence of orienting treatment temperature, and on the same conditions as in First Embodiment except the heat treatment temperature.

Comparative Example 2 a clad textured metal substrate was manufactured by using a commercially available low-purity nickel sheet (with the purity of 99.5%) in place of the nickel sheet (with the purity of 99.99%) used in First Embodiment, and on the same manufacture conditions as in First Embodiment.

Evaluation on orientation; the orientation of a nickel layer was examined on a clad textured metal substrate manufactured according to the above process. The orientation was examined by using an X-ray pole figure analysis (XPFA). FIG. 2 to FIG. 5 illustrate an X-ray pole figure of a (111) face in each sample. As is understood from the FIGS., the nickel layer of clad substrates manufactured in First Embodiment and Second Embodiment clearly shows four independent peaks. From the result, it was confirmed that the nickel layer has adequate orientation. In addition, a deviating angle $\Delta\phi$ was determined from the full width at half maximum (FWHM) of a peak obtained from a $\phi$ scanning result. As a result, the deviating angles $\Delta\phi$ of the nickel layers of the above described samples were 6.0 degrees and 6.5 degrees.

On the other hand, when the nickel layer has been heat-treated for orientation at a low temperature as is shown in Comparative example 1, it was confirmed that the nickel layer is not sufficiently oriented. It was also confirmed that a clad textured metal substrate having low nickel purity in Comparative example 2 had an oriented structure to some extent but did not have complete orientation as is shown in the exemplary embodiment. From the above result, it was confirmed that it is difficult to obtain a substrate having satisfactory crystal structure from a usual commercial nickel sheet after having heat-treated the nickel sheet for orientation.

Figure 6:
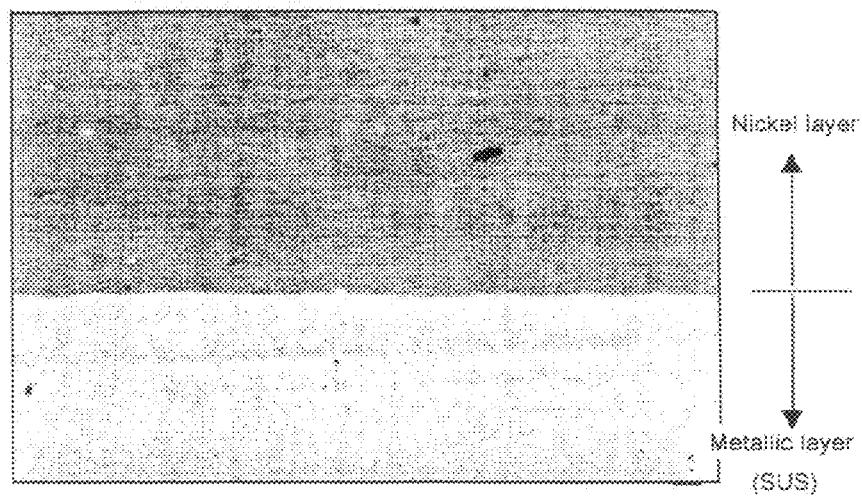
FIG. 6 is a sectional photograph showing a bonded interface between a nickel layer and a metallic layer of a clad textured metal substrate according to First Embodiment.

FIG. 6 is a photograph showing a bonded interface of a clad substrate according to First Embodiment. As is understood from FIG. 6, the interface between the nickel layer and the metallic layer was approximately flat, and the waviness was 300 nm or less.

What is claimed is:

1. A clad textured metal substrate for forming an epitaxial thin film thereon comprising a metallic layer and a nickel layer which is bonded to at least one face of the metallic layer,
wherein the nickel layer has a $\{100\}<001>$ cube texture in which a deviating angle $\Delta\phi$ of crystal axes satisfies $\Delta\phi \leqq 7$ degrees and the nickel layer has a nickel purity of 99.9% or more, and
wherein the metallic layer and the nickel layer form an approximately flat bonded interface of which the waviness is in a range of 1 to 500 nm.

2. The clad textured metal substrate for forming the epitaxial thin film thereon according to claim 1, wherein the nickel layer has a surface roughness Ra of 10 nm or less.

3. The clad textured metal substrate for forming the epitaxial thin film thereon according to claim 2, wherein the metallic layer is made from stainless steel or a nickel alloy.

4. The clad textured metal substrate for forming the epitaxial thin film thereon according to claim 1, wherein the metallic layer is made from stainless steel or a nickel alloy.

5. A method for manufacturing a clad textured metal substrate for forming an epitaxial thin film thereon comprising the following steps (a) to (c):
(a) an orienting heat treatment step of cold-working a nickel sheet having a purity of 99.9% or more at a working rate of 95% or more, and heat-treating the nickel sheet obtained through the cold-working in a non-oxidative atmosphere to make at least the surface part a $\{100\}<001>$ cube texture having a deviating angle $\Delta\phi$ of crystal axes satisfying $\Delta\phi \leqq 7$ degrees;
(b) a step of preparing a metal sheet; and
(c) a surface activated bonding step of dry-etching the surfaces to be bonded of the nickel sheet obtained in the orienting heat treatment step and the metal sheet in a non-oxidation atmosphere to remove the oxide and adsorbate existing on the surfaces to be bonded, and bonding the nickel sheet with the metal sheet without or through the application of pressure, wherein the metal sheet and the nickel sheet form an approximately flat bonded interface of which the waviness is in a range of 1 to 500 nm.

6. The method for manufacturing the clad textured metal substrate for forming the epitaxial thin film thereon according to claim 5, wherein the temperature of orienting heat treatment in the step (a) is 250° C. or higher but a melting point of nickel or lower.

7. The method for manufacturing the clad textured metal substrate for forming the epitaxial thin film thereon according to claim 6, wherein the nickel sheet which is to be subjected to the orienting heat treatment in the step (a) has a thickness of 20 to 200 μm.

8. The method for manufacturing the clad textured metal substrate for forming the epitaxial thin film thereon according to claim 7, wherein the dry-etching method in the surface activated bonding step of the step (c) is any of an ion beam etching method, an atom beam etching method, or a plasma etching method.

9. The method for manufacturing the clad textured metal substrate for forming the epitaxial thin film thereon according to claim 6, wherein the dry-etching method in the surface activated bonding step of the step (c) is any of an ion beam etching method, an atom beam etching method, or a plasma etching method.

10. The method for manufacturing the clad textured metal substrate for forming the epitaxial thin film thereon according to claim 5, wherein the nickel sheet which is to be subjected to the orienting heat treatment in the step (a) has a thickness of 20 to 200 μm.

11. The method for manufacturing the clad textured metal substrate for forming the epitaxial thin film thereon according to claim 10, wherein the dry-etching method in the surface activated bonding step of the step (c) is any of an ion beam etching method, an atom beam etching method, or a plasma etching method.

12. The method for manufacturing the clad textured metal substrate for forming the epitaxial thin film thereon according to claim 10, wherein a pressurizing force applied when bonding the nickel sheet and the metal sheet after having been dry-etched, in the surface activated bonding step of the step (c) is in a range of 0.01 to 300 MPa.

13. The method for manufacturing the clad textured metal substrate for forming the epitaxial thin film thereon according to claim 5, wherein the dry-etching method in the surface activated bonding step of the step (c) is any of an ion beam etching method, an atom beam etching method, or a plasma etching method.

14. The method for manufacturing the clad textured metal substrate for forming the epitaxial thin film thereon according to claim 5, wherein a pressurizing force applied when bonding the nickel sheet and the metal sheet after having been dry-etched, in the surface activated bonding step of the step (c) is in a range of 0.01 to 300 MPa.

15. The method for manufacturing the clad textured metal substrate for forming the epitaxial thin film thereon according to claim 5, further comprising the step of polishing at least the surface of the nickel sheet after having been subjected to the orienting heat treatment to control the surface roughness Ra to 10 nm or less.

16. The method for manufacturing the clad textured metal substrate for forming the epitaxial thin film thereon according to claim 5, wherein a pressurizing force applied when bonding the nickel sheet and the metal sheet after having been dry-etched, in the surface activated bonding step of the step (c) is in a range of 0.01 to 300 MPa.

\* \* \* \* \*